United States Patent [19]

Kobori et al.

[11] Patent Number: 4,802,952
[45] Date of Patent: Feb. 7, 1989

[54] METHOD FOR MANUFACTURING SEMICONDUCTOR ABSOLUTE PRESSURE SENSOR UNITS

[75] Inventors: Shigeyuki Kobori; Kazuji Yamada, both of Hitachi; Ryoichi Kobayashi, Toukai; Atsushi Miyazaki, Katsuta; Seikou Suzuki, Hitachioota, all of Japan

[73] Assignee: Hitachi, Ltd., Tokyo, Japan

[21] Appl. No.: 158,750

[22] Filed: Feb. 22, 1988

[30] Foreign Application Priority Data

Mar. 6, 1987 [JP] Japan .................. 62-49981

[51] Int. Cl.$^4$ ............... H01L 21/306; B44C 1/22; C03C 15/00; C23F 1/02
[52] U.S. Cl. ................. 156/634; 29/621.1; 156/645; 156/656; 156/657; 156/659.1; 156/662; 156/272.2; 73/727; 338/4; 357/26
[58] Field of Search ............. 156/629, 630, 633, 634, 156/645, 653, 655, 656, 657, 659.1, 662, 272.2; 29/610 SG, 620; 338/4, 42; 73/720, 721, 726, 727; 357/26; 437/226, 228

[56] References Cited

U.S. PATENT DOCUMENTS 3,918,019 11/1975 Nunn .................... 338/42
4,291,293 9/1981 Yamada et al. .......... 338/4

FOREIGN PATENT DOCUMENTS 61-20473 9/1986 Japan .

*Primary Examiner*—William A. Powell
*Attorney, Agent, or Firm*—Antonelli, Terry & Wands

[57] ABSTRACT

A method for manufacturing semiconductor absolute pressure sensor units includes anodically bonding a silicon sensor wafer (10) and a silicon cap wafer (12) with a borosilicate glass layer (32) disposed therebetween so as to surround respective sensor chips on the silicon sensor wafer (10) by introducing a matrix shaped conductive layer (28) in contact with and in alignment with the borosilicate glass layer (32), the matrix shaped conductive layer (28) is used as a negative electrode during anodic bonding operation so that a high bonding strength is obtained and sodium ions contained in the borosilicate glass layer (32) are kept away from bond regions after completing the anodically bonding operation.

4 Claims, 6 Drawing Sheets

METHOD FOR MANUFACTURING SEMICONDUCTOR ABSOLUTE PRESSURE SENSOR UNITS

BACKGROUND OF THE INVENTION

The present invention relates to a method for manufacturing semiconductor absolute pressure sensor units by employing anodic bonding process. The semiconductor absolute pressure sensor units thus manufactured are applied to such as in an automobile engine control field and a biomedical field.

Japanese patent application Laid-Open No. 61-202473 laid open on Sept. 8, 1986 discloses a method for manufacturing semiconductor absolute pressure sensor units in which a silicon sensor wafer and a silicon cap wafer are anodically bonded both in wafer state with borosilicate glass layers disposed therebetween by an application of a DC voltage between the silicon cap wafer and the borosilicate glass layers disposed around the circumference of the silicon sensor wafer, and thereafter the bonded silicon sensor wafer and silicon cap wafer is cut out to obtain the semiconductor absolute pressure sensor units.

However the bonding glass layers of the semiconductor absolute pressure sensor unit manufactured according to the above method include a substantial amount of sodium ions ($Na^+$), in particular at the interface between silicon sensor chip and the borosilicate glass layer. The sodium ions include in the glass layers cause a drift to the sensor signal and chemical reactions in the glass layer to reduce the bonding strength and to induce a permanent stress to the pressure sensitive diaphragm of respective units, all of which inclusively reduce the accuracy and reliability of the resultant absolute pressure sensor.

Moreover a bonding strength of the glass layer bonding the silicon sensor chip and the silicon cap chip of the resultant semiconductor absolute pressure sensor units manufactured according to the above method and obtained from the center portion of the wafers is found out to be insufficient which is considered due to insufficient ion migration in the borosilicate glass layers at the center portion of the wafer during anodic bonding process because of the remoteness of the negative terminals which are connected at the circumference of the silicon sensor wafer.

SUMMARY OF THE INVENTION

One object of the present invention is to provide a method for manufacturing semiconductor absolute pressure sensor units employing anodic bonding process which are free from remaining sodium ions in glass layer bond regions between a semiconductor sensor chip and a semiconductor cap chip, whereby the accuracy and the reliability of the resultant semiconductor absolute pressure sensor units are improved.

Another object of the present invention is to provide a method for manufacturing semiconductor absolute pressure sensor units employing anodic bonding process in which the bonding strength of the glass layer bonding the silicon sensor chip and the silicon cap chip of all of the resultant semiconductor absolute pressure sensor units is sufficiently high enough to maintain a predetermined vacuum pressure in the reference pressure chambers of the respective resultant sensor units.

Still further object of the present invention is to provide a method for manufacturing semiconductor absolute pressure sensor units employing anodic bonding process which is suitable for a mass production with a high yield.

A method for manufacturing semiconductor absolute pressure sensor units of the present invention comprises:

a step of preparing a semiconductor sensor wafer of n-type having a plurality of first recesses formed on one surface thereof in matrix so as to constitute pressure sensitive diaphragms, thick boundary area supporting and surrounding the first recesses, a plurality of piezoresistive elements of p-type formed on the other surface of the semiconductor sensor wafer at the respective diaphragms by p-type impurity diffusion, a first conductive layer forming a bridge circuit with the piezoresistive elements at the respective diaphragms and input and output terminals therefor on the thick boundary area of the respective diaphragms, glass layer containing movable ions therein such as borosilicate glass formed in matrix on the other surface of the semiconductor sensor wafer over the thick boundary area, and second conductive strip layer formed in contact with and in alignment with the glass layer in such a manner that the second conductive strip layer surround the respective sensor chips;

a step of preparing a semiconductor cap wafer of substantially the same thermal expansion coefficient as that of the semiconductor sensor wafer having a plurality of second recesses formed on one surface thereof in matrix, a plurality of first and second channels formed on the one surface in matrix adjacent to the second recesses arranged in matrix;

a step of aligning the semiconductor cap wafer on the semiconductor sensor wafer in such a manner that the respective second recesses of the semiconductor cap wafer overlie the respective diaphragms of the semiconductor sensor wafer from the other surface thereof so as to constitute reference vacuum pressure chambers for the respective absolute pressure sensor units, the columns of the first channels of the semiconductor cap wafer overlie the input and output terminals of the respective first conductive layers and the columns of the second conductive strip layer and the rows of the second channel overlie the rows of the second conductive strip layer; and a step of applying a DC voltage between the semiconductor cap wafer and the second conductive strip layer on the semiconductor sensor wafer in such a manner that the semiconductor cap wafer is applied a positive potential and the second conductive strip layer is applied a negative potential so as to bond the semiconductor cap wafer to the semiconductor sensor wafer both in wafer state with the glass layer containing movable ions through anodic bonding process.

In short the features of the present invention are, first, an introduction and formation of the second conductive strip layer in contact with an in alignment with the glass layer containing movable ions therein formed on the thick boundary area of the semiconductor sensor wafer, the second conductive strip layer is used as a negative electrode for anodic bonding process, and, second, an application of a DC voltage between the semiconductor cap wafer and the second conductive strip layer so as to effect anodic bonding between the semiconductor sensor wafer and the semiconductor cap wafer while keeping away the sodium ions from the glass layers constituting bonding regions between the semiconductor sensor wafer and the semiconductor cap wafer.

DESCRIPTION OF THE PREFERRED EMBODIMENT

The same reference numerals in FIGS. indicate the same parts through out FIG. 1 to FIG. 8(g).

Formation of reference vacuum chambers for the semiconductor absolute pressure sensors by anodically bonding, in wafer state, a silicon sensor wafer and a silicon cap wafer is explained with reference to FIGS. 1 to 3.

On one surface of the silicon sensor wafer 10 and within respective sensor chip boundaries, piezoresistive elements 14 and 16 are formed by diffusing boron into the surface. The entire surface is then covered by an insulating film 18 of silicon dioxide for protecting the piezoresistive elements 14 and 16 formed previously Terminals 20 and 22 for the respective piezoresistive elements 14 and 16 are provided through the insulating film 18. Wiring conductive films 24 and input and output terminals 26 therefor, both made of aluminum, are formed over the insulating film 18 to constitute a bridge circuit with the piezoresistive elements 14 and 16 through the terminals 20 and 22 thereof. A matrix shaped conductive layer of aluminum 28 having terminals 30 at its ends, formed simultaneously with the wiring conductive films 24 and the input and output terminals 26, surrounds the respective silicon sensor chip boundaries and is used as a negative electrode for anodic bonding of the silicon sensor wafer 10 and the silicon cap wafer 12. Borosilicate glass layer 32 formed by sputtering on the surface of the silicon sensor wafer 10 in matrix so as to surround the respective silicon sensor chips and to cover the matrix shaped conductive layer 28. The thickness of the borosilicate glass layer 32 is about 5 μm. On the other surface of the silicon sensor wafer 10 recesses 34 are formed under the surface where the piezoresistive elements 14 and 16 for the respective silicon sensor chips are formed so as to constitute pressure sensitive diaphragms 36 for the respective silicon sensor chips.

Figure 2:
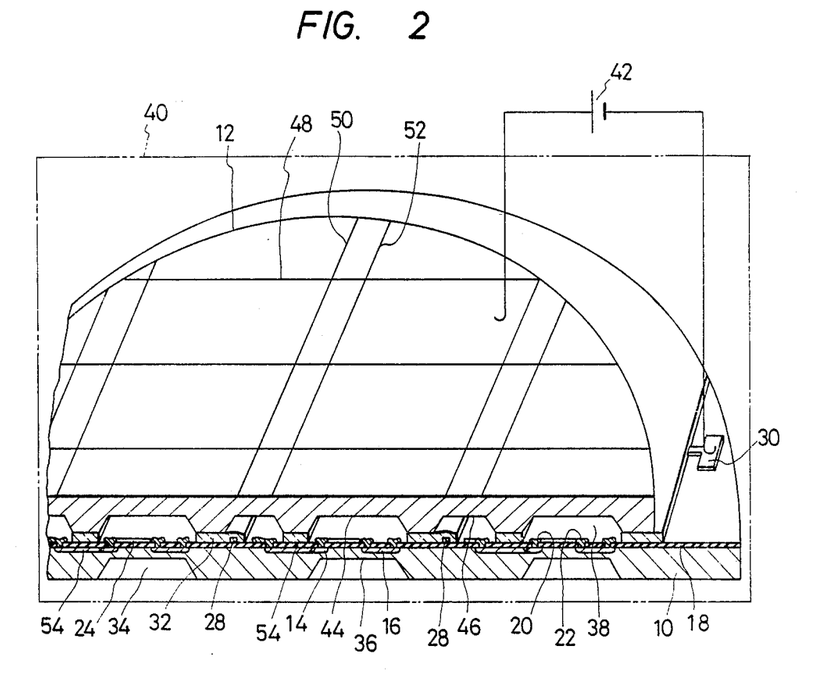
FIG. 2 is a perspective and partly sectional schematic view of overlain semiconductor sensor wafer and semiconductor cap wafer for explaining the present invention.

FIG. 2 is a schematic illustration for explaining anodic bonding between the silicon sensor wafer 10 and the silicon cap wafer 12 both in wafer state according to the present invention. The silicon sensor wafer 10 and the silicon cap wafer 12 aligned thereon so as to constitute reference pressure chambers 38 therewith placed in a vacuum container 40, and a positive potential of a DC source 42 is applied to an appropriate portion of the silicon cap wafer 12 and a negative potential thereof is applied to the terminals 30 of the matrix shaped conductive layer 28 on the silicon sensor wafer 10.

On one surface of the silicon cap wafer 12 facing to the silicon sensor wafer 10, second recesses 44 arranged in matrix and first and second channels 46 and 47 arranged in matrix are provided. The second recesses 44 are for constituting reference pressure chambers 38 together with the respective diaphragms 36 for the respective semiconductor absolute pressure sensor units. The first channels 46 aligned in columns are for accomodating the input and output terminals 26 for the respective semiconductor absolute pressure sensor units and also a portion of the borosilicate glass layer 32 extending outside from the bonding region and swelling above the matrix shaped conductive layer 28. The second channels 47 aligned in rows are for accomodating a somewhat swelling portion of the glass layer 32 due to the underlying conductive layer 28 aligned in rows. The second recesses 44 and the first and second channels 46 and 47 are formed simultaneously by chemical etching. Since the matrix shaped conductive layer 28 is in contact with the portion of the glass layer 32 extending outside from the bonding region, sodium ions ($Na^+$) contained in the borosilicate glass layer 32 are gathered around the matrix shaped conductive layer 28 during anodic bonding operation and are kept away from the bonding region.

On the other surface of the silicon cap wafer 12, grooved cutting marks 48, 50 and 52 are provided for facilitating chipping of the bonded silicon sensor and cap wafers.

The silicon sensor wafer 10 and the silicon cap wafer 12 overlain on the silicon sensor wafer 10 according to respective alignment marks formed thereon (not shown) are set in the vacuum container 40. The vacuum container 40 is evacuated to about $10^{-3}$ Torr and the silicon sensor wafer 10 and the silicon cap wafer 12 are heated up to about 325° C. so as to increase mobility of ions in the borosilicate glass layer 32. Thereafter a DC voltage of about 1000V is applied between the silicon cap wafer 12 and the terminals 30 and the matrix shaped conductive layer 28 through the DC source 42. The silicon cap wafer 12 is connected to the positive terminal of the DC source 42 and the terminals 30 to the negative terminal thereof to effect anodic bonding between the silicon sensor wafer 10 and the silicon cap wafer 12 with the borosilicate glass layer 32. Since whole area of the silicon cap wafer 12 is equipotential, and the respective sensor chips of the silicon sensor wafer 10 are surrounded by the matrix shaped conductive layer 28, the anodic bonding operation is effected as if the operation is carried out chip by chip so that a high bonding strength between the respective silicon sensor chips and the respective silicon cap chips is obtained and a high vacuum in the reference pressure chambers 38 formed thereby of the respective absolute pressure sensor units is maintained.

Figure 3:
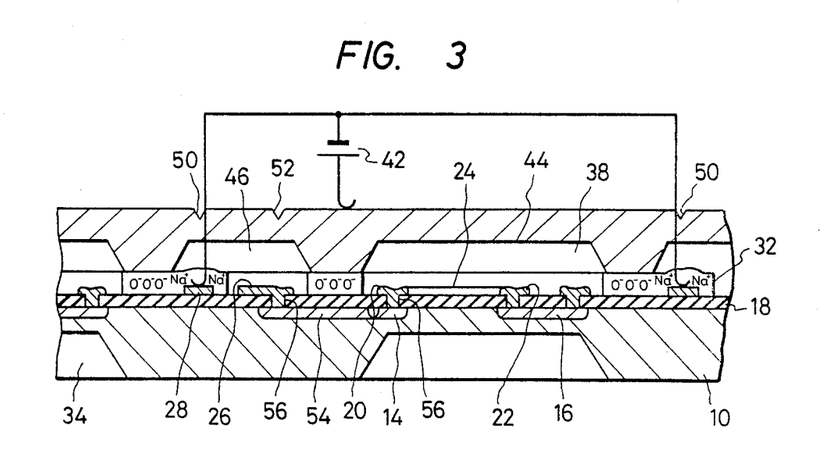
FIG. 3 is an enlarged sectional view of a part of FIG. 2.

The bridge circuit formed with the piezoresistive elements 14 and 16, terminals 20 and 22 thereof and the wiring conductive layer 24 is electrically connected to the input and output terminals 26 through diffusion layers 54 and terminals 56 therefor as shown in FIG. 3.

Since the conductive layer 28 is disposed in matrix on the boundaries between the respective sensor chips of the silicon sensor wafer 10, in other words, the matrix shaped conductive layer 28 is arranged outside the borosilicate glass bond regions of the respective sensor chips, sodium ions contained in the borosilicate glass bond regions migrate toward the matrix shaped conductive layer 28 which is kept at a negative potential during anodic bonding operation so that almost all sodium ions are kept away from the borosilicate glass bond regions.

FIG. 3 shows ion distribution in the borosilicate glass layer 32 after completing anodic bonding between the silicon sensor wafer 10 and the silicon cap wafer 12. By an application of DC voltage between the silicon cap wafer 12 and the terminals 30 of the matrix shaped conductive layer 28, in that, a positive potential to the silicon cap wafer 12 and a negative potential to the matrix shaped conductive layer 28, oxygen ions ($O^-$) contained in the borosilicate glass layer 32 are concentrated near the interface between the silicon cap wafer 12 and the glass layer 32 in the bond regions and the sodium ions ($Na^+$) are concentrated in the glass layer 25 outside the bond regions and near the matrix shaped conductive layer 32 so that the adverse effects of the sodium ions remaining in the bond region glass layer are eliminated.

Figure 4:
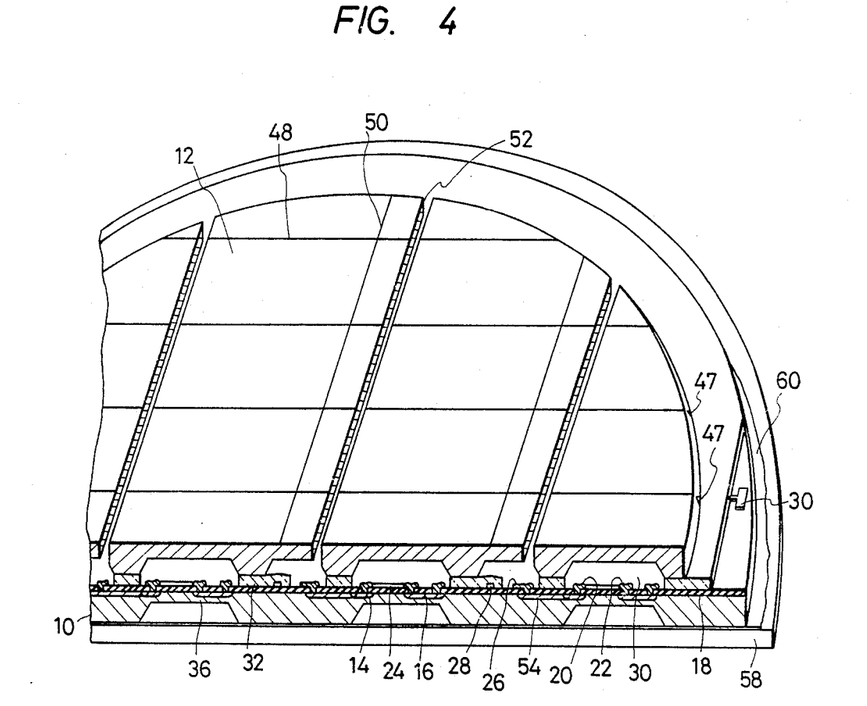
FIG. 4 is a perspective and partly sectional schematic view of the bonded semiconductor sensor wafer and semiconductor cap wafer part after the first cutting operation of the present invention.
Figure 5:
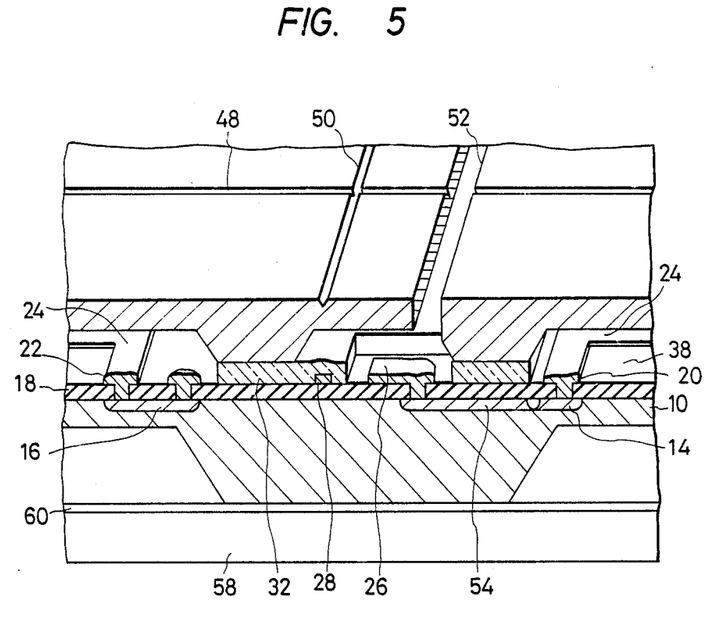
FIG. 5 is an enlarged sectional view of a part of FIG. 4.
Figure 6:
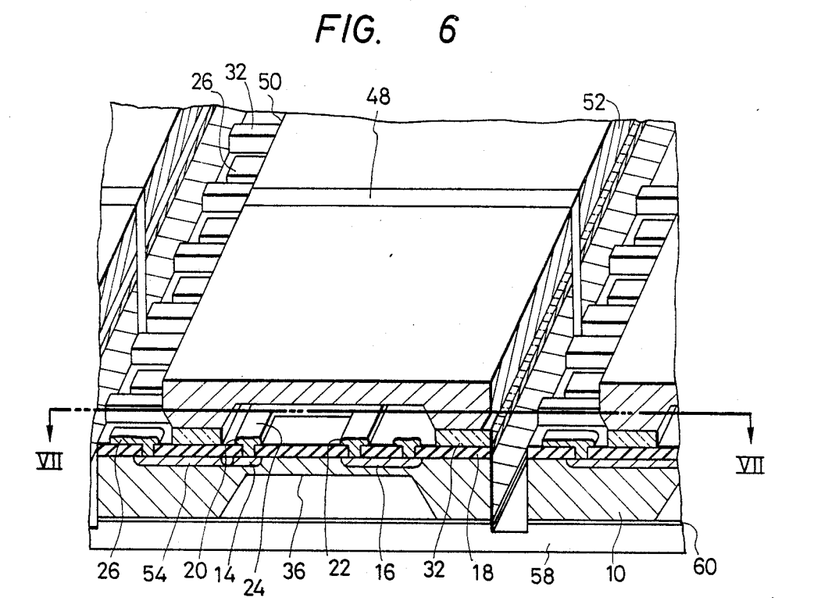
FIG. 6 is a perspective and partly sectional schematic view of the bonded semiconductor sensor wafer and semiconductor cap wafer part after completing cutting operation of the present invention.
Figure 7:
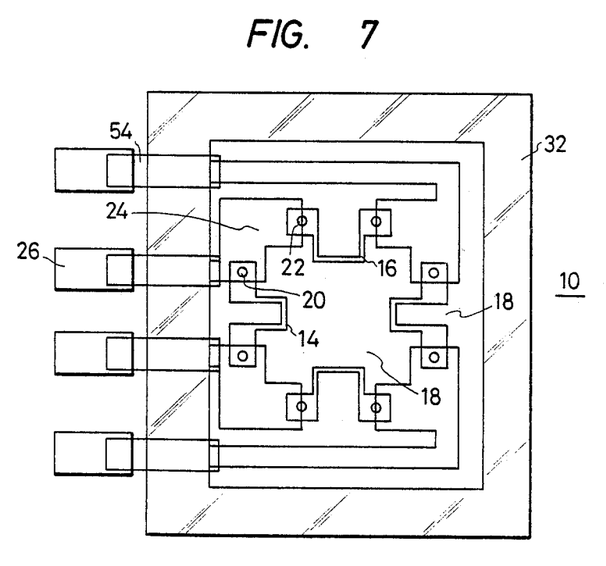
FIG. 7 is a plain view seen from VII—VII of FIG. 6 of the semiconductor absolute pressure sensor unit manufactured according to the present invention.

FIG. 4 shows the anodically bonded silicon sensor wafer 10 and silicon cap wafer 12 after completing the first cutting operation for chipping. FIG. 5 shows an enlarged view of FIG. 4 corresponding to one sensor unit. FIG. 6 shows a part of the anodically bonded silicon sensor wafer 10 and the silicon cap wafer 12 corresponding to one sensor unit after completing the final cutting operation for chipping. FIG. 7 is a plane view of the semiconductor absolute pressure sensor unit thus manufactured.

As shown in FIGS. 4, 5 and 6 a supporting silicon wafer 58 is adhered to the silicon sensor wafer 10, anodically bonded to the silicon cap wafer 12, with wax 60 of low melting temperature before the cutting operation for chipping. At first the silicon cap wafer 12 is cut along the grooved alignment marks 52 to a predetermined depth, then the bonded wafers 10 12 is cut along the grooved alignment marks 50 to a predetermined depth into the supporting silicon wafer 58 and finally the bonded wafer 10 and 12 is cut along the grooved alignment marks 48 to a predetermined depth into the supporting silicon wafer 58. Through the second and third cutting operations the matrix shaped conductive layers 28 used as the negative electrode during anodic bonding operation is cut away together with the borosilicate glass layer 32 therearound containing the concentrated sodium ions so that substantially no sodium ions remains in the glass layers 32.

After the cutting operation, the bonded wafers 10 and 12 supported on the supporting silicon wafer 58 is heated to separate the supporting silicon wafer 58.

Figure 1:
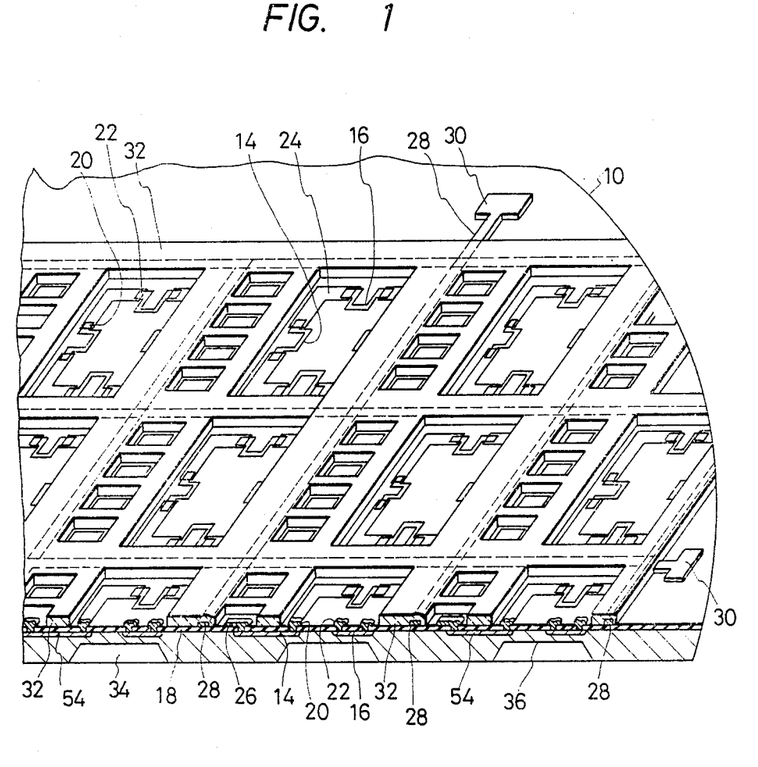
FIG. 1 is a perspective and partly sectional schematic view of semiconductor sensor wafer part, which is employed for the present invention.

FIG. 8(a) to FIG. 8(g) show exemplary steps for preparing the silicon sensor wafer 10 shown in FIG. 1 and illustrate in section of respective processed silicon wafers.

Figure 8A:
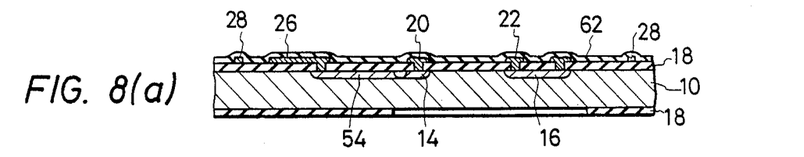
FIGS. 8(a) to (g) illustrate exemplary steps of preparing the semiconductor sensor wafer shown in part and in section and employed for the present invention.
Figure 8B:
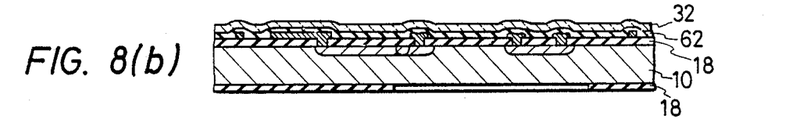
Figure 8C:
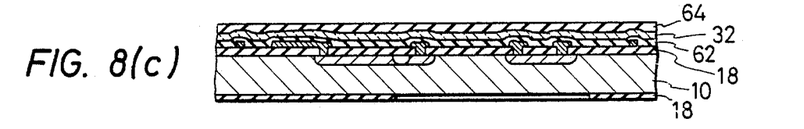
Figure 8D:
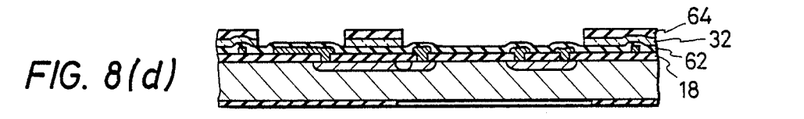
Figure 8E:
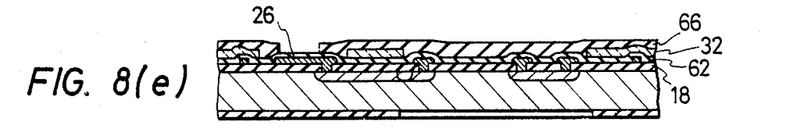
Figure 8F:
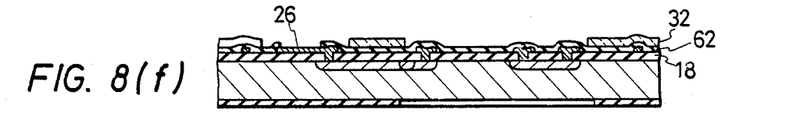
Figure 8G:
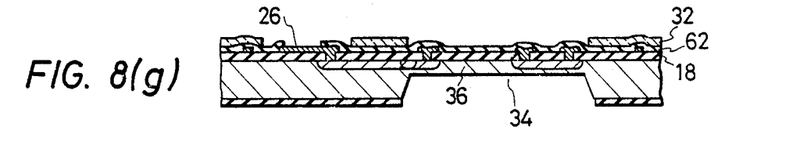

FIG. 8(a) shows a processed silicon wafer before forming the borosilicate glass layer 32, in that, a selective etching film 62 of silicon nitride is deposited over the entire surface of the one surface side of the silicon sensor wafer 10 after the formation of the piezoresistive elements 14 and 16, the terminals 20 and 22 therefor, the conductive diffusion layer 54, the terminals 56 therefor, the insulating films 18, the wiring conductive layers 24, the input and output terminals 26 therefor and the matrix shaped conductive layer 28. Thereafter over the entire surface of the selective etching film 62 the borosilicate glass layer 32 is formed by sputtering as illustrated in FIG. 8(b) and then over the borosilicate glass layer 32 a photoresist is applied to form a photoresist layer 64 which is used for selective etching of the borosilicate glass layer 32 as shown in FIG. 8(c). FIG. 8(d) illustrates a processed silicon sensor wafer after completing selective etching of the borosilicate glass layer 32. After removing the photoresist layer 64 on the borosilicate glass layer 32 shown in FIG. 8(d), again a photoresist is applied to form a photoresist layer 66 over the entire surface covering the selected borosilicate glass layer 32 and the selective etching film 62. Thereafter, a portion of the photoresist layer 66 corresponding to the input and output terminals 26 is selectively etched for removing the selective etching film 62 corresponding thereto as illustrated in FIG. 8(e). FIG. 8(f) illustrates a processed silicon sensor wafer after etching the corresponding selective etching film 62 to expose the input and output terminals 26 and further removing the photoresist layer 66. Finally the recess 34 to constitute the diaphragm 36 is formed from the other surface of the wafer by selective etching as illustrated in FIG. 8(g).

We claim:

1. A method for manufacturing semiconductor absolute pressure sensor units comprising:

a step of preparing a semiconductor sensor wafer (10) of one conductivity type having a plurality of first recesses (34) formed on one surface thereof in matrix so as to constitute diaphragms (36), thick boundary area supporting and surrounding the first recesses (34), a plurality of piezoresistive elements (14, 16) of the other conductivity type formed on the other surface of the semiconductor sensor wafer (10) at the respective diaphragms (36), first conductive layer (24) forming a bridge circuit with the piezoresistive elements (14,16) at the respective diaphragms (36) and input and output terminals (26) therefor disposed on the thick boundary area of the respective diaphragms (36), glass layer (32) containing movable ions therein formed in matrix on the other surface of the semiconductor sensor wafer (10) over the thick boundary area, and second conductive strip layer (28) formed in contact with and in alignment with the glass layer (32);

a step of preparing a semiconductor cap wafer (12) of substantially the same thermal expansion coefficient as that of the semiconductor sensor wafer (10) having a plurality of second recesses (44) formed on one surface thereof in matrix, a plurality of first and second channels (46, 47) formed on the one surface in matrix adjacent to the second recesses (44) arranged in matrix, and cutting marks (48, 50, 52) formed on the other surface of the semiconductor cap wafer (12);

a step of aligning the semiconductor cap wafer (12) on the semiconductor sensor wafer (10) in such a manner that the second recesses (44) of the semiconductor cap wafer (12) overlie the respective diaphragms (36) of the semiconductor sensor wafer (10) from the other surface thereof so as to constitute reference pressure chambers (38) for the respective absolute pressure sensor units, the columns of the first channels (46) of the semiconductor cap wafer (12) overlie the input and output terminals (26) of the respective first conductive layers (24) and the columns of the second conductive strip layer (28) and the rows of the second channels (47) overlie the rows of the second conductive strip layer (28);

a step of applying a DC voltage between the semiconductor cap wafer (12) and the second conductive strip layer (28) on the semiconductor sensor wafer (10) in such a manner that the semiconductor cap wafer (12) is applied a positive potential and the second conductive strip layer (28) is applied a negative potential so as to bond the semiconductor cap wafer (12) to the semiconductor sensor wafer (10) with the glass layer (32) containing movable ions through anodic bonding process; and a step of cutting the bonded semiconductor cap wafer (12) and semiconductor sensor wafer (10) along the cutting marks (48, 50, 52) on the other surface of the semiconductor cap wafer (12) so as to produce a plurality of semiconductor absolute pressure sensor units.

2. A method for manufacturing semiconductor absolute pressure sensor units according to claim 1, wherein first conductive layer (24) and the second conductive strip layer (28) are formed simultaneously.

3. A method for manufacturing semiconductor absolute pressure sensor units according to claim 1, wherein the second conductive strip layer (28) is substantially cut away during said cutting step.

4. A method for manufacturing semiconductor absolute pressure sensor units according to claim 1, wherein the second conductive strip layer (28) is provided with terminals (30) for the DC voltage application at the periphery of the semiconductor sensor wafer (10).

* * * * *